United States Patent [19]

Pardoen

[11] Patent Number: 5,483,695

[45] Date of Patent: Jan. 9, 1996

[54] INTERMEDIATE FREQUENCY FM RECEIVER USING ANALOG OVERSAMPLING TO INCREASE SIGNAL BANDWIDTH

[75] Inventor: Matthijs D. Pardoen, Marin, Switzerland

[73] Assignee: CSEM Centre Suisse D'Electronique et de Microtechnique, Neuchatel, Switzerland

[21] Appl. No.: 226,856

[22] Filed: Apr. 13, 1994

[30] Foreign Application Priority Data

May 12, 1993 [FR] France ........................... 93 05813

[51] Int. Cl.⁶ ............................................. H04B 1/26
[52] U.S. Cl. ...................... 455/314; 455/303; 455/304
[58] Field of Search ............................... 455/205, 207, 455/208, 209, 276.1, 303, 304, 314, 324; 375/322, 334

[56] References Cited

U.S. PATENT DOCUMENTS 5,230,099  7/1993  Leper ............................. 455/303
5,303,417  4/1994  Laws ............................. 455/314

FOREIGN PATENT DOCUMENTS

WO9302507  2/1993  WIPO .

OTHER PUBLICATIONS

Electronics & Wireless World, Sutton, "Direct-conversion FM design", vol. 96, No. 11, Nov. 1990, pp. 962–967.
Electronic Components & Applications, Eindhoven, "A complete f.m. radio on a chip", vol. 5, No. 3, Jun. 1983, pp. 159–170.

*Primary Examiner*—Reinhard J. Eisenzopf
*Assistant Examiner*—Marsha D. Banks-Harold
*Attorney, Agent, or Firm*—Pollock, Vande Sande & Priddy

[57] ABSTRACT

An FM receiver comprising a local oscillator (23), a heterodyning stage (24) and a demodulator stage (33). The heterodyning stage has a signal producing arrangement and a multiplier arrangement. The signal producing arrangement (25,26,27,29,30,31,32) produces n signals $a_1 \ldots a_n$ wherein each signal consists of a message signal modulated at the intermediate frequency of the receiver, and these signals $a_1 \ldots a_n$ are related by the expression $$a_i = \cos [\omega_{IF} t + k_f \int^t A(t)*dt + \Omega + \pi*(i/n)]$$

where $\omega_{IF}$, $k_f$ and $\Omega$ are constants, n is a positive integer greater than or equal to 2 and i takes the values of all positive integers up to and including n. The multiplier arrangement (28) multiplies the n signals together and thus produces an output signal from the heterodyning stage, wherein the message signal is modulated at a frequency of n times the intermediate frequency.

20 Claims, 4 Drawing Sheets 5,483,695

INTERMEDIATE FREQUENCY FM RECEIVER USING ANALOG OVERSAMPLING TO INCREASE SIGNAL BANDWIDTH

TECHNICAL FIELD

This invention relates generally to radio receivers for receiving a frequency modulated (FM) message signal, and in particular to radio receivers for receiving an FM message signal comprising a local oscillator for producing a local oscillator signal, a heterodyning stage for heterodyning said received modulated message signal with said local oscillator so as to reduce the frequency which is modulated by said message signal to an intermediate frequency and a demodulator stage for accepting an output signal from said heterodyning stage and extracting said message signal therefrom. The FM receiver is suitable for use in a single integrated circuit and it will be convenient to hereinafter disclose the invention relation to that exemplary relation. It is to be appreciated, however, that the invention is not limited to that application.

BACKGROUND OF THE INVENTION

Frequency modulation is widely used today in the transmission of message signals, due principally to its noise suppression properties. Frequency modulation refers to the process whereby the frequency of a carrier signal is modulated by a message signal—the amplitude of the carrier signal is intended to remain constant. The information in FM signals is thus contained in the zero crossings of the modulated signal which are detected by a receiver. European commercial stereo broadcast FM is radiated in a band extending from 88 to 108 MHz.

FM receivers are often of the heterodyne type, in which incoming signals received by the receiver are mixed with a signal from a local oscillator, so as to reduce the frequency of the incoming signal and thereby enable better filtering thereof.

The frequency of the local oscillator can be controlled with respect to the carrier frequency so that the variable radio frequency of each signal channel may be converted to a fixed intermediate frequency. The modulated intermediate frequency signal can then be detected by appropriate demodulation circuitry.

FIG. 1 shows an example of a down-conversion superheterodyne FM receiver 1 which comprises essentially an antenna 2, a radio frequency (RF) stage 3, a mixer 4, a local oscillator 5, an intermediate-frequency (IF) filter 6, a amplifier/limiter 7, a demodulator 8, an automatic frequency control (AFC) stage 9, an audio amplifier 10 and a speaker 11. The antenna 2 captures signals within a range including the 88–108 MHz FM transmission band and transmits corresponding electrical signals to the RF stage 3.

The RF stage 3 is tuned to the carrier frequency $f_c$ of a desired signal channel and amplifies the electrical signals received from the antenna 2 within a frequency bandwidth centered on the frequency $f_c$, whilst rejecting unwanted image frequencies. The local oscillator signal and the RF stage signal are multiplied by the mixer 4, so that the message signal at the output of the mixer 4 is modulated at the intermediate frequency $f_{IF}$.

The tuning of the local oscillator 5 and the RF stage 3 is coupled so as to improve the image frequency rejection of the FM receiver 1. The operating characteristics of the IF filter 6 are chosen so that only signals within a bandwidth centered around the intermediate frequency $f_{IF}$ are passed.

The amplifier/limiter 7 limits the amplitude of the signal passed by the IF stage 6 in order to remove any AM component therefrom.

The FM demodulator 8 demodulates the signal from the amplifier/limiter 7 and passes the message signals thus extracted to the audio amplifier 10. Signals are then sent from the output of the audio amplifier 10 to the speaker 11 for reproduction. Finally, the AFC stage 9 fine tunes the frequency $f_{LO}$ of the local oscillator signal according to the DC output of the demodulator 8 in order to keep the frequency IF constant.

In many FM receivers, the intermediate frequency $f_{IF}$ is chosen to be about 10.7 MHz, which is slightly larger than one-half of the FM broadcast band of 20 MHz, so that all image frequencies lie outside the broadcasting band. Superheterodyne FM receivers which use such high intermediate frequencies may be largely integrated in a single integrated circuit, however the signal processing involved in such receivers necessitates the use of off-chip tuned LC circuits, and ceramic or surface acoustic wave (SAW) filters in the RF, heterodyning and demodulation stages of the receiver.

The use of lower intermediate frequencies that can be tuned by fully integrated low Q filters removes the need for these off-chip filters, thereby enabling the production of a single chip FM receiver which uses only a minimum of external components.

Consequently, some existing FM receiver designs thus use an intermediate frequency $f_{IF}$ of 70 kHz and can be implemented substantially as single integrated circuits. This intermediate frequency value is chosen so that the image frequency of a selected signal channel occurs about halfway between the center frequency of that signal channel and that of the adjacent channel.

However, a shortcoming in such FM receivers is their reduced bandwidth. Aliasing causes severe distortion when the modulation frequency, that is, the frequency of the message signal, exceeds the intermediate frequency $f_{IF}$. Moreover, offsets in multipliers and edge detectors used in demodulators result in the occurrence of severe aliasing distortion when the modulation frequency exceeds half the intermediate frequency. The reduction in the intermediate frequency $f_{IF}$ to 70 kHz results therefore in a corresponding reduction in the bandwidth of the message signal which can be received and demodulated by the FM receiver.

SUMMARY OF THE INVENTION

Aliasing distortion is particularly a problem in FM transmission systems which use Frequency Division Multiplexing. European Commercial FM broadcasting is an example of such a system, where stereo information is modulated onto a 38 kHz subcarrier and low amplitude Radio Data System (RDS) signals are PSK modulated around 57 kHz. To recover the low amplitude digital information, the FM demodulator's output bandwidth should ideally be at least 60 kHz. It can therefore be understood that the use of an intermediate frequency in the order of 70 kHz will result in the aliasing of high amplitude 13 kHz Mono audio signals with low amplitude RDS signals. The maximum intermediate frequency used is dictated by the desired image frequency rejection and by the signal channel spacing in the FM broadcast band. The audio bandwidth of the demodulated signals thus cannot be improved by simply increasing the intermediate frequency $f_{IF}$ of the receiver.

It is an object of the present invention to provide a radio receiver for receiving frequency modulated message signals which alleviates the disadvantages of the prior art.

With this object in mind, the present invention provides a radio receiver for receiving a selected FM signal in which a message signal A(t) modulates the frequency of carrier signal, comprising a local oscillator for producing a local oscillator signal, a heterodyning stage for heterodyning said selected FM signal with said local oscillator signal so as to reduce the frequency which is modulated by said message signal to an intermediate frequency, and a demodulator stage for accepting an output signal from said heterodyning stage and extracting said message signal therefrom, characterised in that said heterodyning stage comprises signal producing means for producing n signals $a_1 \ldots a_n$ wherein each signal consists of said message signal modulated at said intermediate frequency, said signals $a_1 \ldots a_n$ being related by the expression $$a_i = \cos[\omega_{IF}t + k_f \int^t A(t)*dt + \Omega + \pi*(i/n)]$$

where $\omega_{IF}$, $k_f$ and $\Omega$ are constants, n is a positive integer greater than or equal to 2 and i takes the values of all positive integers up to and including n, and multiplier means for multiplying said n signals together and thus producing said heterodyning stage output signal wherein said message signal is modulated at a frequency of n times said intermediate frequency.

As the frequency of the modulated intermediate-frequency signal is multiplied by a factor of n, the demodulated bandwidth of the message signal is thus correspondingly increased by a factor of n without requiring a change in the intermediate frequency used in the FM receiver.

BRIEF DESCRIPTION OF THE DRAWINGS

The following description refers in more detail to the various features of the present invention. To facilitate an understanding of the present invention, reference is made in the description to the accompanying drawings where tile radio receiver is illustrated in two embodiments. It is to be understood that the radio receiver of the present invention is not limited to the embodiments as illustrated in the drawings.

In the drawings.

DETAILED DESCRIPTION OF THE INVENTION

Figure 2:
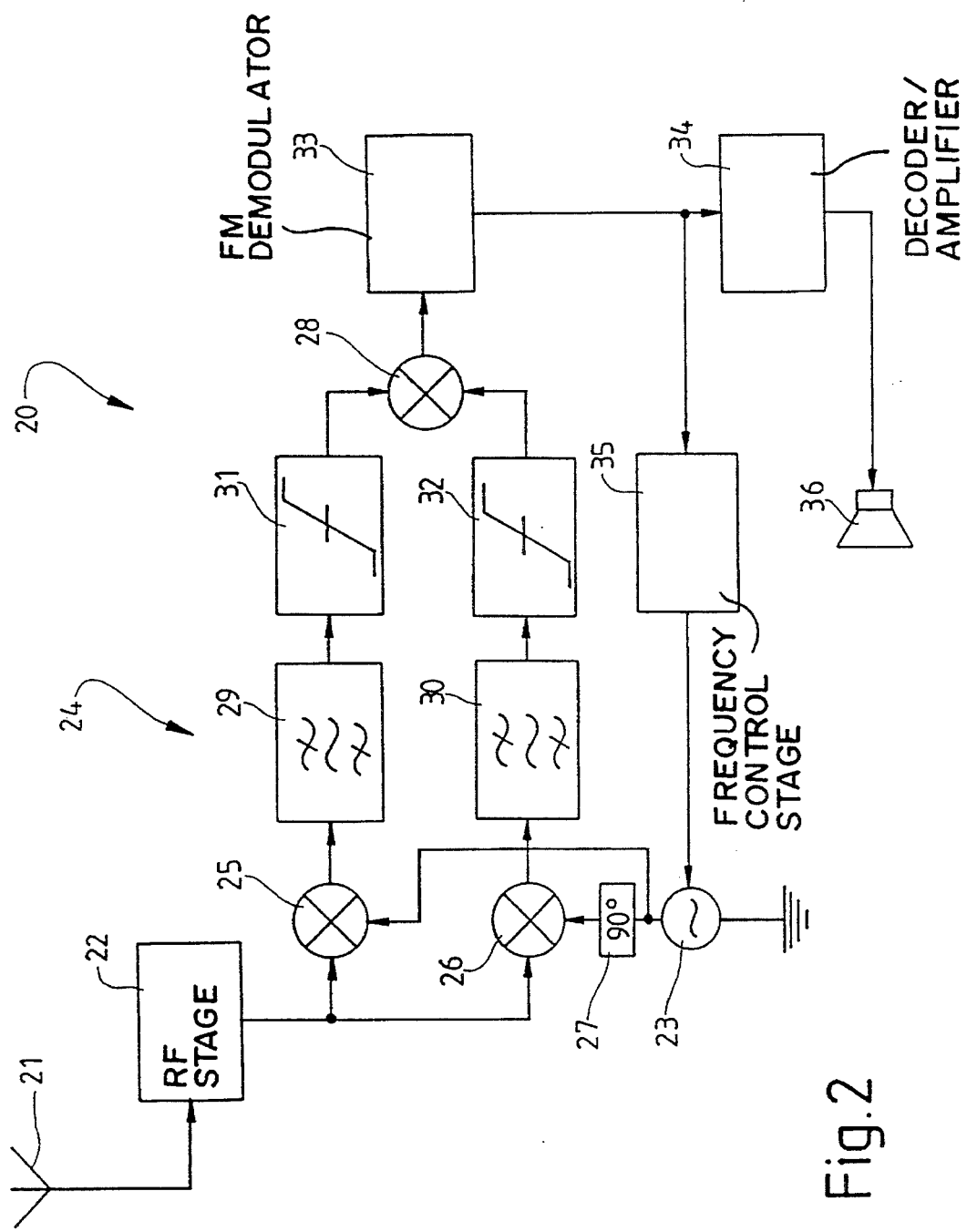
FIG. 2 is a schematic diagram of one embodiment of the FM receiver according to the present invention.

Referring to FIG. 2, there is shown generally a radio receiver 20 for receiving a frequency modulated message signal. The receiver 20 comprises an antenna 21, an RF stage 22, a local oscillator 23 and a heterodyning stage 24, this latter comprising two RF mixers 25 and 26, a phase shifter 27 and a low frequency mixer 28. The antenna 21 and RF stage 22 operate in the same manner as the antenna 2 and RF stage 3 of the receiver 1, so that FM signals are received by the antenna 2 and corresponding electrical signals passed to the RF stage 3 which then passes only those frequency modulated message signals within a bandwidth centered on the selected carrier frequency $f_c$. The local oscillator 23, as described previously, supplies a local oscillator signal having a frequency $f_{LO}$ which is set to equal the carrier frequency $f_c$ plus or minus the desired intermediate frequency $f_{IF}$ of the receiver 1.

The signal from the local oscillator is supplied to the phase shifter 27 wherein its phase is shifted by 90°. This phase shifted signal and the original local oscillator signal thus form two signals, both of which have the frequency $f_{LO}$ but are in quadrature with each other.

The original local oscillator signal and the signal from the RF stage 22 are multiplied by the mixer 25 so as to reduce the modulated IF frequency of the receiver 20. The signal from the phase shifter 27 is multiplied with the signal from the RF stage 22 by the mixer 26, so that at its output the selected message signal also modulates a signal having the intermediate frequency $f_{IF}$. However, the signal modulated by the message signal at the output of the mixer 26 is in quadrature with the signal modulated by the message signal at the output of the mixer 25.

The signals at the outputs of the two mixers 25 and 26 can thus be represented as follows:

$$I(t) = \cos[\omega_{IF}t + k_f \int^t A(t)*dt + \Omega] \quad (1), \text{ and}$$

$$Q(t) = \cos[\omega_{IF}t + k_f \int^t A(t)*dt + \Omega + \pi/2] \quad (2)$$

where A(t) is the selected message signal.

The IF stage 24 also comprises bandpass filters 29 and 30, both tuned to the intermediate frequency $f_{IF}$, and amplifier/limiters 31 and 32. The signal I(t) is passed through the bandpass filter 29 and any AM component is removed by the amplifier/limiter 31. Similarly, the signal Q(t) is passed through the bandpass filter 30 and any AM component is removed by the amplifier/limiter 32.

From (1) and (2) above, it can be seen that the zero crossings of the signals I(t) and Q(t) occur at different times. When $k_f \int^t A(t).dt << \pi/2$, and at $\Omega=0$, it follows that these zero crossing points are respectively given:

$$t_{I=0} \approx \pi/(2*f_{IF}) \text{ and } t_{Q=0} \approx (n+\frac{1}{2})/(2*f_{IF})$$

with n being a positive integer. This indicates that the zero crossings of the signal Q(t) occur exactly in between the zero crossings of the signal I(t).

Figure 1:
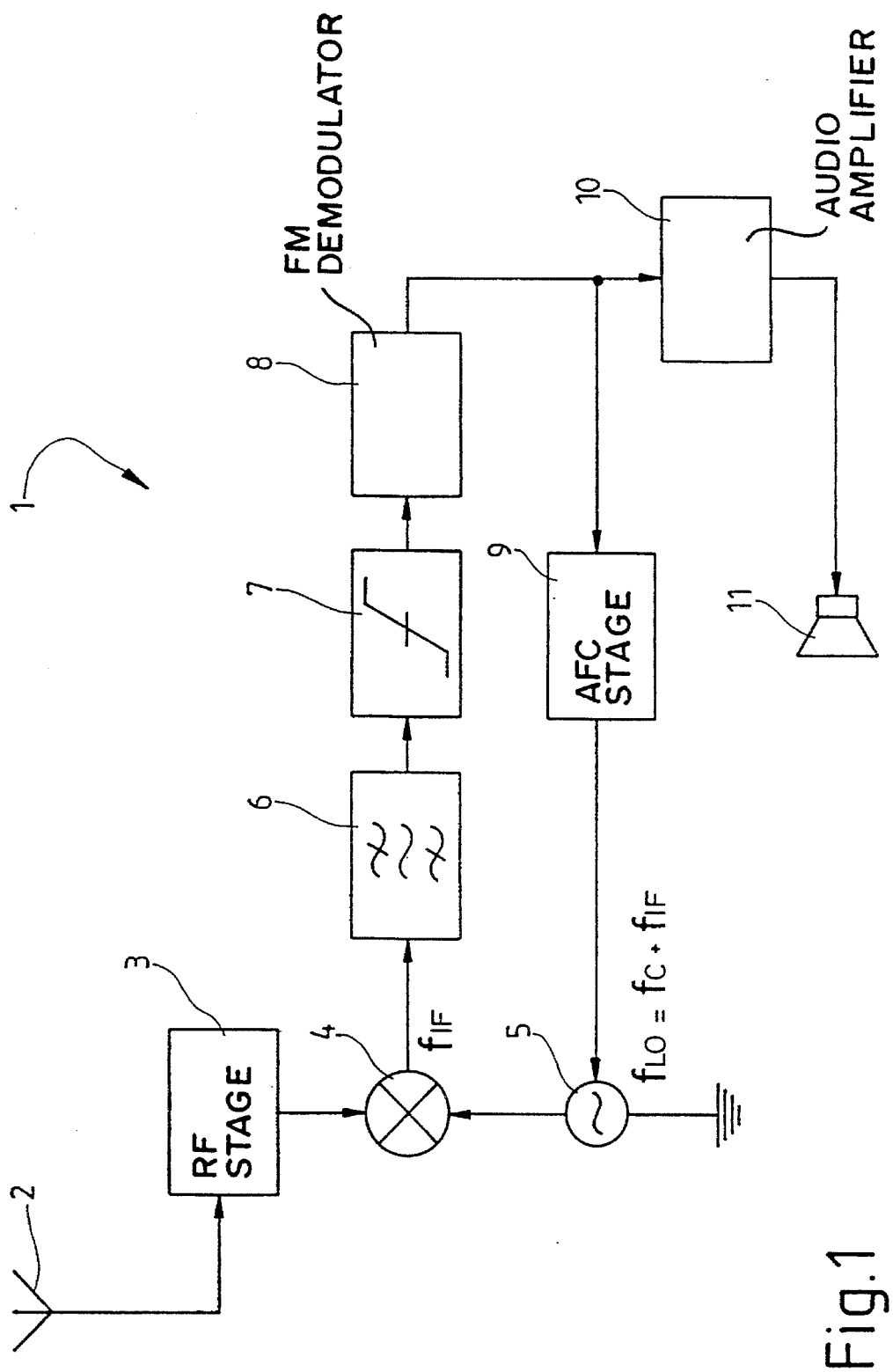
FIG. 1, already described, is a schematic diagram of an FM receiver according to the prior art.

As described previously, the audio bandwidth in FM receivers such as that shown in FIG. 1 is limited by their intermediate frequency. In such prior art receivers, aliasing occurs when the frequency of the message signal A(t) exceeds half the intermediate frequency $f_{IF}$. This limitation may also be described in terms of an analog sampling process, where the sample points of the message signal A(t) are determined by the zero crossings of the analog frequency modulated IF signal. Unlike normal sampling processes, however, the information extracted in frequency modulated signals is not contained in the instantaneous value of the waveform sampled, but in the instants at which the samples are taken.

Returning now to FIG. 2, it can be seen that in both of the signals I(t) and Q(t) the message signal A(t) is sampled at the rate of the intermediate frequency $f_{IF}$. However, in the signal I(t) the moments at which the message signal A(t) is sampled are exactly between the sample moments in the signal Q(t). The mixer 28 combines the signals I(t) and Q(t) so as to produce at its output an oversampled version of the signal from the mixer 25. The message signal A(t) is therefore effectively sampled at twice the rate of the intermediate frequency $f_{IF}$ so that the frequency of the message signal A(t) at which aliasing commences, i.e. the demodulated message signal bandwidth, is doubled. An FM receiver according to the present invention is thus able to use an intermediate frequency of 70 kHz and still be able to demodulate the RDS signals available in commercial FM broadcasting which are modulated onto a 57 kHz subcarrier. Aliasing will not now occur until the message signal A(t) has a frequency greater than the intermediate frequency itself, this being twice the 35 kHz distortion limit of existing FM receivers.

The FM receiver 20 further comprises an FM demodulator 33, an audio decoder/amplifier 34, an automatic frequency control stage 35 and a speaker 36. The FM demodulator 33 demodulates the signal from the mixer 28 and may be of the type using slope detection, a phase-locked-loop, a frequency-locked-loop, quadrature detection or any other suitable FM demodulation technique.

The signal from the demodulator 33 is amplified by the decoder/amplifier 34 and is subsequently passed to the speaker 36. Whilst FIG. 2 shows a mono-FM receiver only, it is to be appreciated that the present invention is also applicable to stereo-FM receivers wherein the decoder/amplifier, speakers and associated filters of the receiver are adapted to treat and reproduce a stereo signal. It is to be appreciated that in other embodiments of the present invention the signals from the demodulator 33 may not be passed to a speaker for audio reproduction. The signals from the demodulator 33 may, for example, be frequency-division multiplexed signals for use in telemetry or other applications involving the communication of message signals.

Figure 3:
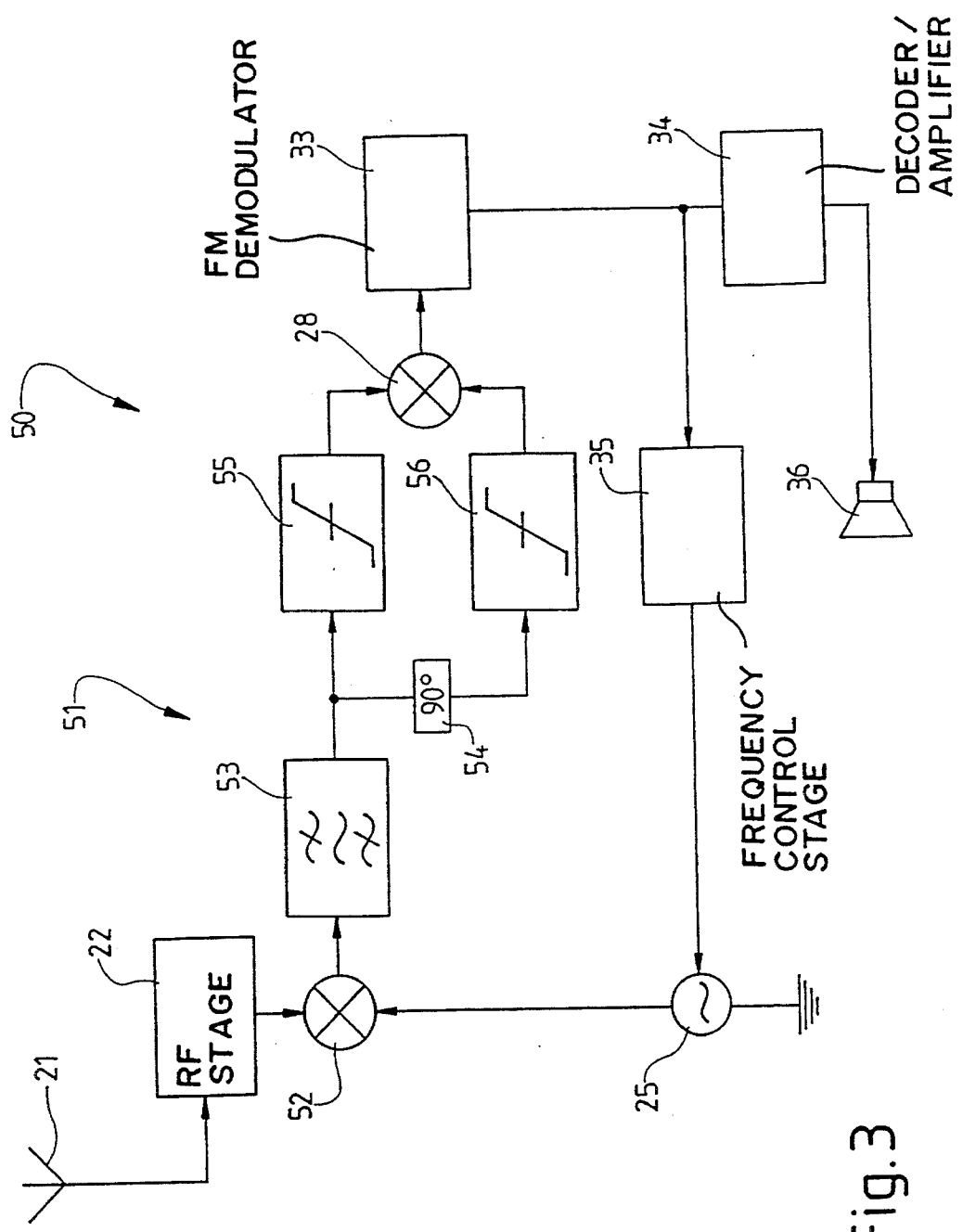
FIG. 3 is a schematic diagram of another embodiment of the FM receiver of the present invention; and, FIG. 4 is a schematic diagram of another embodiment of the heterodyning stage used in the FM receiver of the present invention from those depicted in either of FIGS. 2 or 3.

In an alternative embodiment of the present invention to that shown in FIG. 2, an FM receiver 50 is shown in FIG. 3 which has the antenna 21, RF stage 22, local oscillator 25, mixer 28, FM demodulator 33, decoder/amplifier 34, AFC stage 35 and speaker 36 of the FM receiver 20. The function and operation of these receiver components is identical to that described previously.

The FM receiver 50 further comprises a heterodyning stage 51 having a mixer 52 and a bandpass filter 53, a phase shifter 54 and limiter/amplifiers 55 and 56. In this embodiment, the mixer 52 multiplies the signals from the local oscillator 25 and RF stage 22 so as to reduce the frequency of the signal which the selected message signal modulates to the intermediate frequency $f_{IF}$. This IF signal is then passed through the bandpass filter 53 and the limiter/amplifier 55 and applied to one input of the mixer 28. The phase-shifter 54 also takes the IF signal from the output of the bandpass filter 53 and shifts its phase by 90°. The output from the phase-shifter 54 is then passed through the limiter/amplifier 56 before being applied to the other input of the mixer 28.

As above, the signals applied to the two inputs of the mixer 28 both comprise the message signal modulated at the intermediate frequency $f_{IF}$, however the two signals are in quadrature with each other. At the output of the mixer 28, the message signal is thus sampled at a frequency of twice the intermediate frequency, doubling the previous bandwidth of the demodulated message signal. Message signals having frequencies up to the intermediate frequency $f_{IF}$ can thus be demodulated by the receiver 50, without the need to increase the intermediate frequency itself.

In both of the above embodiments, two quadrature signals are thus created which are modulated at the intermediate frequency of the receiver and subsequently combined so that the message signal is effectively sampled at twice the frequency of the intermediate frequency. Whichever of the exemplary embodiments is used will depend on the requirements of a particular application. For example, the FM receiver 20 shown in FIG. 2 includes an extra mixer following the RF stage so that the power consumption is increased. However, in the FM receiver 50 shown in FIG. 3 the phase shifter 54 is required to operate at lower frequencies than the phase shifter 26 in FIG. 2, and is thus more difficult to realize.

In yet another alternative embodiment to that shown in FIG. 2, the phase shifter 27 may be removed and an RF phase shifter connected to the RF stage 22 so as to shift the phase of the RF stage output signal applied to one of the mixers 25 or 26 by $\pi/2$ radians. When the signals received by the mixers 25 and 26 are multiplied by the local oscillator signal, two quadrature signals are thus produced at their outputs.

FIGS. 2 and 3, and the embodiment described in the preceding paragraph, represent specific examples of a more general principle which may be implemented according to the present invention to increase the demodulated message signal bandwidth of FM receivers. Whilst the above embodiments use only two signals having a phase difference of 90° from each other, n signals $a_1 \ldots a_n$ having a phase difference of $\pi/n$ from each other may equally be created within the FM receiver, where n is a positive integer greater than or equal to 2, where these signals are related by:

$$a_i(t) = \cos [\omega_{IF}t + k_f \int^t A(t)^* dt + \Omega + \pi^*(i/n)]$$

where $\omega_{IF}$, $k_f$ and $\Omega$ are constants and i takes the values of all positive integers up to and including n Replacing $(\omega_{IF}t + k_f \int^t A(t)^* dt + \Omega)$ by $\emptyset$ in each of this expression, it can be seen that:

$a_1 = \cos [\emptyset + \pi/2]$ and $a_2 = \cos [\emptyset + \pi]$, for n= 2, $a_1 = \cos [\emptyset + \pi/3]$, $a_2 = \cos [\emptyset + 2\pi/3]$ and $a_3 = \cos [\emptyset + \pi]$, for n= 3, $a_1 = \cos [\emptyset + \pi/4]$, $a_2 = \cos [\emptyset + \pi/2]$, $a_3 = \cos [\emptyset + 3\pi/4]$ and $a_4 = \cos [\emptyset + \pi]$, for n= 4, and so on.

After passing each signal through an amplifier/limiter to remove any amplitude modulation, all of the Limited signals $a_1$ to $a_n$ are then multiplied together to create the analog IF oversampling of the message signal. Thus for two signals $a_1$ and $a_2$, the message signal is sampled at twice the intermediate frequency, each signal sampling the message signal with phase delay of $\pi/2$ radians after the other. For three signals $a_1$, $a_2$ and $a_3$, the message signal is sampled at three times the intermediate frequency, each signal sampling the message signal after a phase delay of $\pi/3$ radians from the previous one, and so on. The bandwidth of the demodulated message signal is increased by a factor of two, three, four, etc. respectively.

The FM demodulator and other remaining components within the FM receiver will naturally need to be adapted in each case to handle the increased sampling frequency of the message signal.

Figure 4:
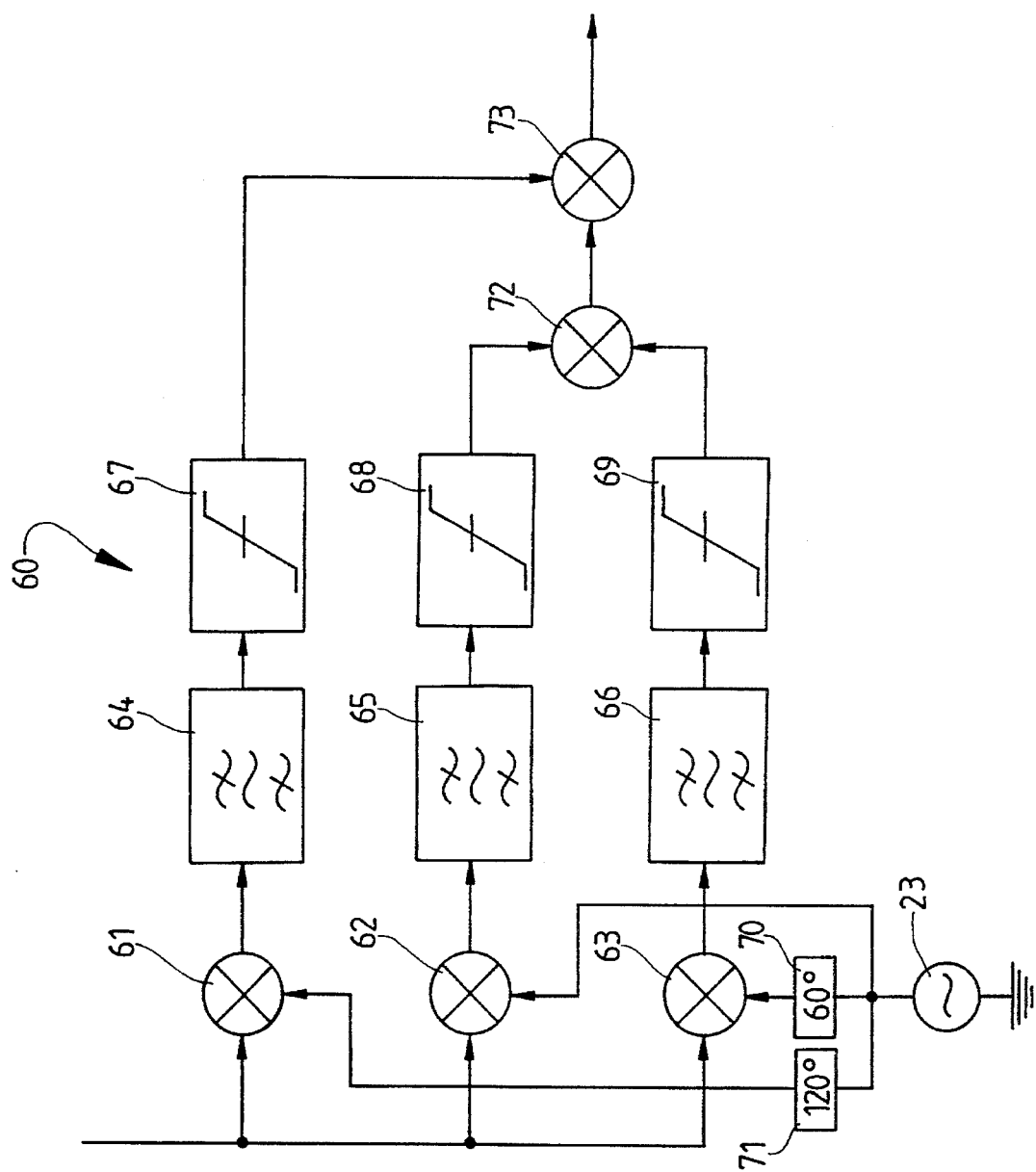

FIG. 4 shows another embodiment of the heterodyning stage from those depicted in either of FIGS. 2 or 3. In this embodiment three signals phase-shifted by $\pi/3$ radians from each other are created and subsequently multiplied together so as to produce an oversampled message signal. An IF stage 60 is shown which comprises three RF mixers 61, 62 and 63, three bandpass filters 64, 65 and 66, three amplifier/limiters 67, 68 and 69, two phase shifters 70 and 71 and two further mixers 72 and 73. The RF stage, FM demodulator and other remaining components of the FM receiver are not shown.

The phase shifters 70 and 71 shift the phase of the signal from the local oscillator 23 by 60° and 120° respectively so that, together with the original local oscillator signal, three signals are created each having the local oscillator frequency but shifted in phase by 60° from each other. These three signals are multiplied with the signal from the RF stage by the mixers 61, 62 and 63 so as to produce at their outputs three IF signals which are phase shifted by 60° from each other.

These IF signals are passed through the bandpass filters 64. 65 and 66 and the amplifier/limiters 67, 68 and 69 and are subsequently multiplied together in two stages. The signals at the outputs of the limiters 68 and 69 are firstly multiplied together by the mixer 72. The signal from the output of the limiter 67 is then multiplied with the signal from the output of the mixer 72 by the mixer 73. The output of the mixer 73 thus provides a signal in which the message signal is effectively sampled at three times the intermediate frequency $f_{IF}$. It is to appreciated that the signals from the outputs of the limiters 67, 68 and 69 may be multiplied together in any order and not only the order described above. Alternatively, a mixer having multiple inputs may be used to multiply all three IF signals together at once.

It will understood that the signals in a particular FM receiver may created according to the arrangement shown in any one of FIGS. 2, 3 or 4, or a combination of thereof. One or more of these signals may also be created in an arrangement whereby two or more mixers are used to multiply the local oscillator signal by the signal from the RF stage, and RF phase shifters are introduced to shift the phase of the RF stage signal supplied to one or more of these mixers. By way of illustration, in the case of an FM receiver using four signals phase shifted from each other by $\pi/2$ radians, three phase shifters may be provided to shift the local oscillator signal by 45°, 90° and 135° respectively Four mixers may also be provided following the RF stage for multiplying the signal from the RF stage by one of each of the signals from the three phase shifters (plus the original local oscillator signal), so as to produce the four signals.

Alternatively, one mixer only may be provided for multiplying the signals from the RF stage and the local oscillator. Three phase shifters may be provided to phase shift the signal from the output of the mixer by 45°, 90° and 135°, the signals from the outputs of these phase shifters, together with the original mixer output signal, thus providing the four phase shifted signals.

In another embodiment, one phase shifter may be provided to shift the phase of the local oscillator signal by 45°. Two mixers may be provided to multiply the RF stage signal by the signal from the phase shifter and the original local oscillator signal respectively. Two further phase shifters may also be provided to phase shift the outputs of the two mixers by 90°, so that the signals from the outputs of these further phase shifters together with the original signals from the two mixers form the four signals.

It will be appreciated that such variation is possible for FM receivers having n signals and that the various alternative configurations of mixers and phase shifters need not be described in order to understand the above principle behind this flexibility of design. Whilst phase shifters of only $\pi/2$ radians are illustrated in FIGS. 2 and 3, and of $\pi/3$ and $2\pi/3$ radians in FIG. 4, other embodiments may require phase shift networks which change the phase of a signal by different angular amounts in order to create the n signals which lead to the analog oversampling of the message signal.

Finally, it is to be understood that various other modifications and/or additions may be made to the FM receiver without departing from the ambit of the present invention as defined in the claims appended hereto.

What is claimed is:

1. A radio receiver for receiving a selected FM signal in which a message signal A(t) modulates the frequency of a carrier signal, said radio receiver comprising:

a local oscillator for producing a local oscillator signal;

a heterodyning stage for heterodyning said selected FM signal with said local oscillator signal so as to reduce the frequency which is modulated by said message signal to an intermediate frequency; and, a demodulator stage for accepting an output signal from said heterodyning stage and extracting said message signal therefrom;

wherein said heterodyning stage comprises:

signal producing means for producing n signals $a_1 \ldots a_n$ wherein each of said n signals consists of said message signal A(t) modulated at said intermediate frequency, and said n signals $a_1 \ldots a_n$ are related by the expression $$a_i = \cos\{\omega_{IF}t + k_f \int^t A(t)^* dt + \Omega + \pi^*(i/n)\}$$

where $\omega_{IF}$, $k_f$ and $\Omega$ are constants, n is a positive integer greater than or equal to 2 and i takes the values of all positive integers up to and including n, and multiplier means for multiplying said n signals together and thus producing said heterodyning stage output signal wherein said message signal A(t) is modulated at a frequency of n times said intermediate frequency.

2. A radio receiver according to claim 1, wherein said signal producing means includes:

one or more phase shifters each for shifting the phase of said local oscillator signal so as to produce a phase-shifted signal, and two or more mixers each for multiplying said selected FM signal with a different one of said phase-shifted signals and said local oscillator signal so as to produce one or more of said n signals.

3. A radio receiver according to claim 2, wherein said signal producing means further includes one or more phase shifters each for shifting the phase of one of said n signals so as to produce another one of said n signals.

4. A radio receiver according to claim 3, wherein said signal producing means further includes:

one or more RF phase shifters each for shifting the phase of said selected FM signal so as to produce a phase-shifted selected FM signal, and two or more further mixers each for multiplying said local oscillator signal with a different one of said phase-shifted selected FM signal and said selected FM signal so as to produce one or more of said n signals.

5. A radio receiver according to claim 4, wherein said demodulator stage is tuned to a frequency of n times said intermediate frequency.

6. A radio receiver according to claim 5, wherein said heterodyning stage further comprises n limiters for removing any amplitude modulation from said n signals prior to their multiplication by said multiplier means.

7. A radio receiver according to claim 6, wherein said heterodyning stage further comprises one or more filters through each of which one of said n signals is passed.

8. A radio receiver according to claim 7, wherein each of said filters is tuned to said intermediate frequency.

9. A radio receiver according to claim 8, wherein said FM signal is a commercial broadcast FM radio signal.

10. A radio receiver according to claim 1, wherein said signal producing means includes one or more phase shifters each for shifting the phase of one of said n signals so as to produce another one of said n signals.

11. A radio receiver according to claim 1, wherein said signal producing means includes:
   one or more RF phase shifters each for shifting the phase of said selected FM signal so as to produce a phase-shifted selected FM signal, and
   two or more further mixers each for multiplying said local oscillator signal with a different one of said phase-shifted selected FM signal and said selected FM signal so as to produce one or more of said n signals.

12. A radio receiver according to claim 1, wherein said demodulator stage is tuned to a frequency of n times said intermediate frequency.

13. A radio receiver according to claim 1, wherein said heterodyning stage further comprises n limiters for removing any amplitude modulation from said n signals prior to their multiplication by said multiplier means.

14. A radio receiver according to claim 1, wherein said heterodyning stage further comprises one or more filters through each of which one of said n signals is passed.

15. A radio receiver according to claim 14, wherein each of said filters is tuned to said intermediate frequency.

16. A radio receiver according to claim 1, wherein said FM signal is a commercial broadcast FM radio signal.

17. A radio receiver according to claim 2, wherein said signal producing means further includes:
   one or more RF phase shifters each for shifting the phase of said selected FM signal so as to produce a phase-shifted selected FM signal, and
   two or more further mixers each for multiplying said local oscillator signal with a different one of said phase-shifted selected FM signal and said selected FM signal so as to produce one or more of said n signals.

18. A radio receiver according to claim 2, wherein said demodulator stage is tuned to a frequency of n times said intermediate frequency.

19. A radio receiver according to claim 2, wherein said heterodyning stage further comprises n limiters for removing any amplitude modulation from said n signals prior to their multiplication by said multiplier means.

20. A radio receiver according to claim 2, wherein said heterodyning stage further comprises one or more filters through each of which one of said n signals is passed.

\* \* \* \* \*